US009698181B2

(12) United States Patent
Moldovan et al.

(10) Patent No.: US 9,698,181 B2
(45) Date of Patent: Jul. 4, 2017

(54) SEMICONDUCTOR DETECTOR DEVICE

(75) Inventors: Grigore Moldovan, Oxford (GB);
Angus Ian Kirkland, Oxford (GB);
Chao Lin, Oxford (GB)

(73) Assignee: Oxford University Innovation Limited, Oxford (GB)

( * ) Notice: Subject to any disclaimer, the term of this patent is extended or adjusted under 35 U.S.C. 154(b) by 122 days.

(21) Appl. No.: 14/236,533

(22) PCT Filed: Jul. 13, 2012

(86) PCT No.: PCT/GB2012/051679
§ 371 (c)(1),
(2), (4) Date: Feb. 14, 2014

(87) PCT Pub. No.: WO2013/017828
PCT Pub. Date: Feb. 7, 2013

(65) Prior Publication Data
US 2014/0159189 A1  Jun. 12, 2014

(30) Foreign Application Priority Data

Aug. 3, 2011 (GB) .................................. 1113436.8

(51) Int. Cl.
*H01L 27/146* (2006.01)
*H01L 27/144* (2006.01)
(52) U.S. Cl.
CPC .... *H01L 27/14605* (2013.01); *H01L 27/1446* (2013.01); *H01L 27/14603* (2013.01); *H01L 27/14636* (2013.01)
(58) Field of Classification Search
CPC ........... H01L 27/1446; H01L 27/14605; H01L 27/14636; H01L 27/14603
(Continued)

(56) References Cited

U.S. PATENT DOCUMENTS 5,117,114 A * 5/1992 Street .................... G01T 1/2018
250/370.09
6,218,668 B1 4/2001 Luke
(Continued)

FOREIGN PATENT DOCUMENTS

GB 2070241 A 9/1981
JP 61-275683 12/1986
WO WO-2010095657 A1 8/2010

OTHER PUBLICATIONS

Makynen A et al: "High performance CMOS position-sensitive photodetectors (PSDs)", Circuits and Systems, 1998. ISCAS '98. Proceedings of the 1998 IEEE International Symposium on Monterey, CA, USA May 31-Jun. 3, 1998, New York, NY, USA, IEEE, US, vol. 6,May 31, 1998 (May 31, 1998), pp. 610-616.
(Continued)

*Primary Examiner* — Vongsavanh Sengdara
(74) *Attorney, Agent, or Firm* — Honigman Miller Schwartz and Cohn LLP

(57) ABSTRACT

A semiconductor detector device comprises a layer of semiconductor material for generating charge in response to an input event and an array of pixels for collecting charge. Tracks are connected to the pixels to supply signals representing the collected charge to a reader circuit. The pixels are grouped into sets, all the pixels within a set being connected to the same track, the sets of pixels being interwoven so that so that any group of n adjacent pixels capable of collecting charge generated by a single input event is connected to a combination of n tracks that is unique to the group of pixels, where n has a value of one of 2, 3 or 4. This allows detection of position of the area of charge collection on the basis of temporally coincident signals on a combination of at least n tracks.

9 Claims, 13 Drawing Sheets

(58) Field of Classification Search
USPC .......................................................... 257/443
See application file for complete search history.

(56) References Cited

U.S. PATENT DOCUMENTS

2003/0222200 A1    12/2003  Skurnik et al.
2012/0175498 A1*   7/2012  Krymski ........... H01L 27/14609
                                                                         250/208.1

OTHER PUBLICATIONS

Makynen A et al: "Linear and sensitive CMOS position-sensitive photodetector", Electronics Letters, IEE Stevenage, GB, vol. 34, No. 12, Jun. 11, 1998 (Jun. 11, 1998), pp. 1255-1256.
Macri et al., "Single-Sided CZT Strip Detectors", IEEE Transactions on Nuclear Science, vol. 51, No. 5, Oct. 2004.
Macri et al., "Readout and Performance of Thick CZT Strip Detectors with Orthogonal Coplanar Anodes", IEEE Nuclear Science Symp. Medical Imaging Conf., Norfolk, VA, 2002.
International Search Report for Application No. PCT/GB2012/051679 dated Jul. 11, 2012.
United Kingdom Search Report for Application No. GB1113436.8 dated Dec. 4, 2011.
Japanese Office Action for Application No. 2014-523379 dated Aug. 30, 2016 (along with English Translation).

* cited by examiner

SEMICONDUCTOR DETECTOR DEVICE

BACKGROUND

The present invention relates to semiconductor detector devices for position-sensitive detection of sparse events.

Semiconductor detector devices are devices that use a layer of semiconductor material to generate charge in response to an input event, and then collect the charge to provide detection of that event. Position-sensitivity of the detection may be provided by collecting the charge in an array of pixels. This allows the positions of events to be determined on the basis of the position of the pixels that collect the charge. In many cases the events are relatively sparse so that only one or a small number of events occur simultaneously, and this allows the design of the semiconductor detector device to be simplified.

Two main types of semiconductor detector device are known that may be used to detect sparse events, namely an active pixel detector device or a strip detector device.

In an active pixel detector device, the pixels are arranged to be operated in a voltaic mode in which the charge is collected on the pixel and periodically read out. In this case, each pixel comprises an arrangement of active devices integrated with the layer of semiconductor material, for example with a CMOS (complimentary metal-oxide-semiconductor) construction. Typically, the active devices include a buffer device arrangement arranged to buffer a signal representative of the charge collected by the pixel and a sampling device arrangement that allows the buffered signal to be read out onto tracks connected to the pixels. The sampling device arrangements of the pixels are then selectively activated to read out the signals. In this manner, the pixels are scanned, for example by selectively activating rows of pixels to read out the signals simultaneously for the pixels in each column that are connected to the same track. The position of a detected event is determined from the row currently being sampled and the column of the track on which the signal appears.

An active pixel detector device is commonly used for applications requiring continuous detection of multiple events, for example in an image sensor in which events across the entire array are simultaneously detected. An active pixel detector device may also be used to detect sparse events, but in that case suffers from the disadvantage of having a relatively low detection bandwidth as the readout time is shared between multiple pixels as the array is scanned. Furthermore, there are disadvantages in the construction. The scanning of the array of pixels introduces complexity into the design of the control circuit to provide the addressing of individual pixels. The design and the construction of the arrangement of active devices in each pixel are also complex.

A strip detector device is a type of device that avoids some of these limitations of active pixel detector device. In particular, the layer of semiconductor material is arranged to be operated in a conductive mode in which the collected charge is continuously detected by contacts arranged as an array of parallel strips on each side of the layer of semiconductor material extending at an angle to each other, typically perpendicular. An event generates charge that is simultaneously collected by contacts on each side of the semiconducting material. The position of a detected event is determined from the overlap between the strips, due to the perpendicular crossing arrangement of the array of strips.

A strip detector device may be used to detect sparse events, including events that are sufficiently separated in time, and in some arrangements a limited number of simultaneous events that may be discriminated on the basis of a characteristic of the detected signal. However, a strip detector device has the disadvantage of requiring contacts to be provided on both sides of the layer of semiconductor material, which creates difficulties both in forming the contacts themselves and providing connections to both sides. This prohibits the use of some manufacturing techniques and even where possible increases manufacturing costs. Formation of contacts on both sides of the layer of semiconductor material also limits the possibility of integrating additional devices into the layer of semiconductor material for example using a CMOS construction.

It would be desirable to provide a semiconductor detector device that may be used to provide position-sensitive detection of sparse events but in which at least some of the above described difficulties with an active pixel detector device or a strip detector device are alleviated.

SUMMARY

According to the present invention, there is provided a semiconductor detector device comprising:

a layer of semiconductor material for generating charge in response to an input event;

an array of pixels formed in the layer of semiconductor material for collecting charge generated in the layer of semiconductor material, the pixels being spatially distributed in two dimensions;

tracks connected to the pixels to supply signals from the pixels representing the collected charge to a reader circuit, wherein the pixels of the array are grouped into sets of pixels, all the pixels within a set being connected to the same track, the sets of pixels being interwoven so that any group of n adjacent pixels capable of collecting charge generated by a single input event is connected to a combination of n tracks that is unique to the group of pixels, where n has a value of one of 2, 3 or 4.

The present invention allows position sensitive detection of sparse events from the array of pixels on one side of the layer of semiconductor material. This is achieved by connecting sets of pixels to the same track, but interweaving the sets of pixels so that any group of n adjacent pixels capable of collecting charge generated by a single input event are connected to a combination of n tracks that is unique to the overlapped group of pixels. As a result, in use, an area of charge collection overlapping any group of n adjacent pixels causes signals to be supplied on a unique combination of n tracks. Thus, the position of the area of charge collection, and hence the event, is indicated by the combination of n tracks on which temporally coincident signals are supplied. This is achieved even though the spatial referencing of an individual pixel occurs only from being in the set to which the track is connected. Such spatial referencing is not itself in two dimensions, as is the case in an active pixel detector wherein each pixel is spatially referenced in a first dimension (row) by the sampling control lines that control the sampling device arrangement and a second dimension (column) by the tracks to which a set of pixels is connected. However, the identification of position is derived instead by the combination of tracks on which coincident signals are supplied, derived from the pattern of interweaving of the sets.

The present invention provides advantages over the known types of semiconductor detector device described above as follows.

As compared to active pixel detectors, the present invention provides the following advantages. Firstly, the architecture allows position-sensitive detection to be performed by simultaneously monitoring of all the tracks for temporally coincident detection, and therefore the pixels do not need to continuously be scanned to identify new events. For the case of sparse events, the readout time is therefore more efficiently used and the detection bandwidth is higher. Secondly, the pixels may be permanently connected to readout circuitry, avoiding the need to configure the readout on-the-fly for each pixel or block addressing. This simplifies the architecture of the control circuit, reduces design costs and also reduces power consumption. Thirdly, even in the case that a pixel has an arrangement of active devices, this arrangement is simplified as the sampling device arrangement is not required. As well simply reducing the complexity of pixels, this allows for more radiation-hard pixel design.

As compared to a strip detector device, the present invention provides the following advantages. Firstly, the present invention allows a similar performance to be achieved with a construction that is simplified by the patterning of pixels being required only on one side of the layer of semiconductor material. This reduces the number of steps required for fabrication and therefore reduces the manufacture costs. As an alternative to simplifying the construction in this manner, a similar arrangement of pixels could be provided on both sides of the layer of semiconductor device to effectively produce two stacked detectors on the same layer of semiconductor material. This would be advantageous in some applications, for example by enabling tracking with only one semiconductor detector device. Secondly, the present invention is compatible with CMOS technology. This compatibility further reduces cost for high volume manufacture, and allows close integration with other CMOS devices. Thirdly, the present invention can provide an improved coincidence analysis and increased detection rate by arrangement of the sets of pixels in more than two orientations.

Sets of pixels may be interwoven in many different patterns to provide the required position sensitivity. The pattern of interweaving may provide the unique relationship between groups of adjacent pixels and combinations of tracks for groups of size 2, 3 or 4 pixels, depending on the pattern. Generally speaking, more complex patterns of weaving provide the unique relationship between groups of pixels and tracks is provided for smaller groups of pixels. Some examples of patterns of interweaving are described in the detailed description below.

Although without limitation to the present invention, simplicity of analysis may be provided by the sets of pixels being lines of pixels spatially distributed across the array. In this case, the lines of pixels may be grouped into at least two sub-arrays of pixels, the lines of pixels within each sub-array being spatially distributed across the array of pixels in directions which are different for each sub-array. In this manner each sub-array of pixels indicates the position of the area of charge collection in a different direction, that is the direction in which the lines of pixels within that sub-array are spatially distributed. In this manner, the use of two or more sub-arrays allows the position to be indicated in two dimensions. By way of example, in the case that the array of pixels is a regular rectangular array, the lines of pixels may be straight lines of pixels, and the sub-arrays of pixels may include at least one sub-array in which the pixels of each line are spatially distributed in a row or column direction to indicate position in the row or column direction and/or the at least two sub-arrays of pixels may include at least one sub-array in which the pixels of each line are spatially distributed in a diagonal direction to indicate position in the diagonal direction.

A simple pattern of interweaving might utilize two sub-arrays, for example in the row and column direction respectively, or in the row (or column) direction and in a diagonal direction respectively. In this case, the unique relationship between groups of adjacent pixels and combinations of tracks may be provided for groups of 4 pixels, for example, by interweaving the pixels of the two sub-arrays alternately in the row direction and the column direction.

Additional benefits may be achieved by utilizing more sub-arrays, for example in the row, column and diagonal directions. In this case, the unique relationship between groups of adjacent pixels and combinations of tracks may be provided for groups of 3 pixels, for example, by interweaving the pixels of three sub-arrays, or for groups of 2 pixels by interweaving the pixels of four sub-arrays. Additional interweaved sets may be used to reduce the number of pixels required to obtained a unique relationship between groups of adjacent pixels and combinations of track for a single input event, but also to maintain such unique relationships when simultaneous input event occur.

The array of pixels may be a regular rectangular array which has the advantage of simplicity and is suitable for many applications, for example in which the events may occur with equal likelihood in any position. However, a rectangular array is not essential. The array may have other regular arrangements, or in the general case may be irregular, albeit at the expense of complicating the signal analysis needed to determine position.

To allow better understanding, an embodiment of the present invention will now be described by way of non-limitative example with reference to the accompanying drawings, in which:

DETAILED DESCRIPTION

There is described semiconductor detector devices of two types, namely an active pixel detector device 10 and a weaved strip detector device 50.

First, there is described the active pixel detector device 10 comprising an array of pixels 11.

Figure 1:
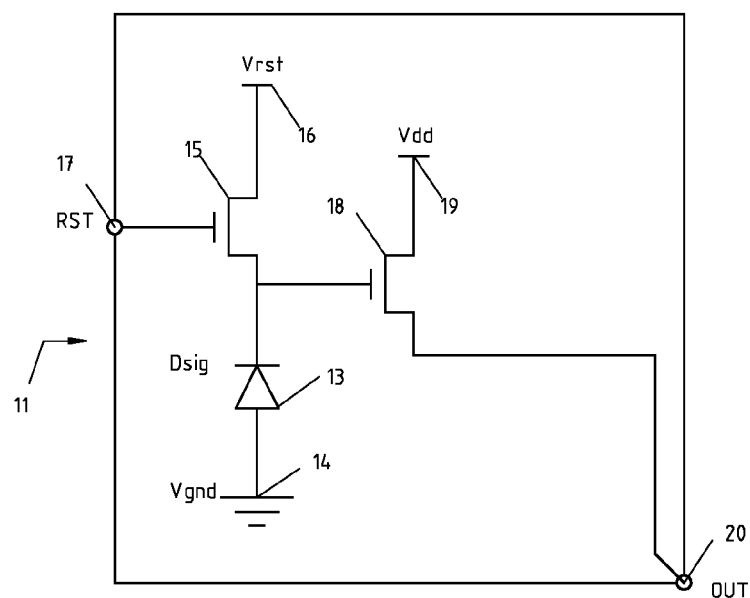
FIG. 1 is a diagram of a pixel of an active pixel detector device.

The active pixel detector device 10 has a conventional CMOS construction in which the pixels 11 are formed in a semiconductor layer 12 of semiconductor layer 12. As shown in FIG. 1, each pixel 11 comprises a diode 13 formed in the semiconductor layer 12, for example silicon. The diode 13 is connected to an electrode arrangement 14 formed on one side of the semiconductor layer 12 to provide a ground potential and to the following arrangement of active devices formed on the other side of the semiconductor layer 12, being for example CMOS transistors.

An event such as an interaction with a particle to be detected causes charge to be generated in an area of the semiconductor layer 12 around the event, which charge is collected by the diodes 13 of the pixels 11 overlapping that area. The diodes 13 are arranged to operate in a voltaic mode in which the charge collected thereby accumulates.

A reset device 15 is connected between the diode 13 and a reset line 16 that supplies a reset voltage Vrst to all the pixels 11. The reset device 15 acts as a switch controlled by a reset control signal RST on a reset control line 17 connected to the input of the reset device 15. In accordance with the reset control signal RST, the reset device 15 selectively applies the reset voltage Vrst to the input of the diode 13 for resetting the diode at the start of acquisition by discharging any collected charge. The reset control line 17 may be connected in common to every pixel 11, or to sub-arrays of pixels, for resetting the pixels 11 either periodically, or after detection of an event.

The diode 13 is also connected to the input of a buffer device 18 biased by a bias voltage Vdd on a bias line connected to all the pixels 11. The buffer device 18 buffers and amplifies the voltage across the diode to produce an output signal OUT representative of the charge collected by the diode 13 and supplies that output signal OUT to an output 20.

The diode 13, reset device 15 and buffer device 18 have a construction that is typical of a conventional 3T active pixel detector device, but the pixel 11 is simplified in that no sampling device is required between the buffer device 18 and the output 20. Hence the reset control line 17 is the only input and there is no further sampling control input.

Figure 2:
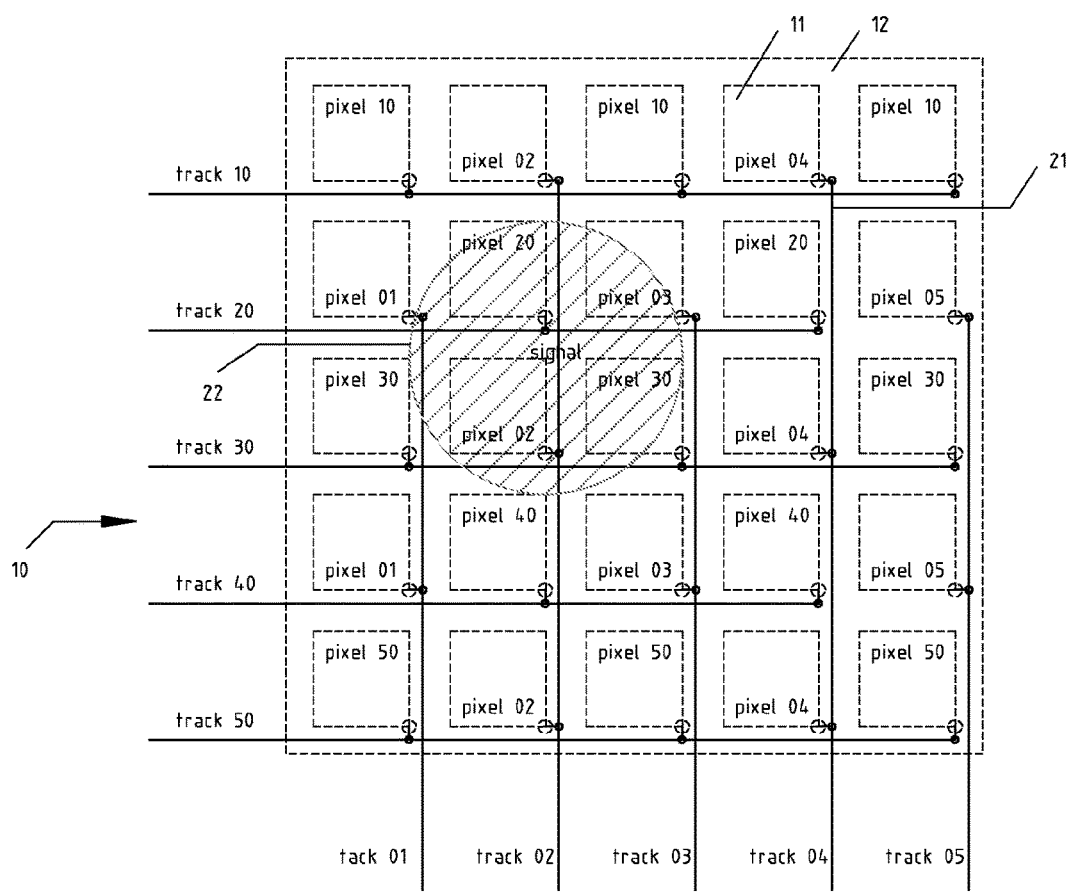
FIG. 2 is a diagram of an active pixel detector device incorporating the pixel of FIG. 1.

As shown in FIG. 2, the pixels 11 are spatially distributed continuously across an area of the active pixel detector device 10 in two dimensions by being arranged in a regular, rectangular array. The semiconductor layer 12 may extend outside that area in which the pixels 11 are distributed.

The outputs 20 of the pixels 11 are connected to tracks 21 that extend across the semiconductor layer 12 to supply the output signals OUT to a readout circuit 31 described below. Each track 21 is connected to a set of pixels 11 in the following pattern.

Each track 21 is connected to a set of pixels 11 that is a line of pixels 11 spatially distributed across the array, in this instance being a straight line in the row or column direction of the rectangular array. Thus, the lines of pixels 11 extending in each of the row and column directions are grouped together into a respective sub-array of pixels 11, within which the lines of pixels 11 are spatially distributed in the column and row directions, respectively. For example, in the sub-array of pixels 11 labeled x0, the pixels 11 within each line are spatially distributed in the row direction and the lines of pixels 11 are spatially distributed in the column direction. Similarly, in the sub-array of pixels 11 labeled 0x, the pixels 11 in each line are spatially distributed in the column direction and the lines of pixels 11 are spatially distributed in the row direction.

Furthermore, the two sub-arrays of pixels 11 are interwoven, in this case by the pixels 11 of the two sub-arrays alternating in the row and column direction of the overall array, i.e. in a checkerboard pattern. As a result, any group of four adjacent pixels 11 capable of collecting charge from a single input event are connected to a combination of four tracks that is unique to the group of pixels 11, being in this weaved pattern two tracks 21 in each sub-array. This means that an area 22 of charge collection of that sufficient size to overlap a group of four pixels causes signals to be supplied on a unique combination of four tracks. Accordingly position sensitive detection may be provided on detection of coincident signals on a group of four tracks. The position is indicated by the combination of four tracks that is unique to a group of four adjacent pixels. Thus the spatial resolution is at the pitch of the lines of pixels 11 in the two sub-arrays.

By way of example, FIG. 2 illustrates an area 22 of charge collection overlapping four pixels 11 that supply output signals OUT to tracks 20, 30, 02, 03. The position of the area 22 of charge collection is therefore indicated by the combination of tracks 21 on which an output signal OUT appears. An example shown in FIG. 2, the position of the area 22 is indicated in the column direction by the output signals OUT on the tracks 20 and 30 on the basis of one sub-array of pixels 11 and in the row direction by the signals appearing on tracks 02 and 03 from the pixels in the other sub-array.

Figure 3:
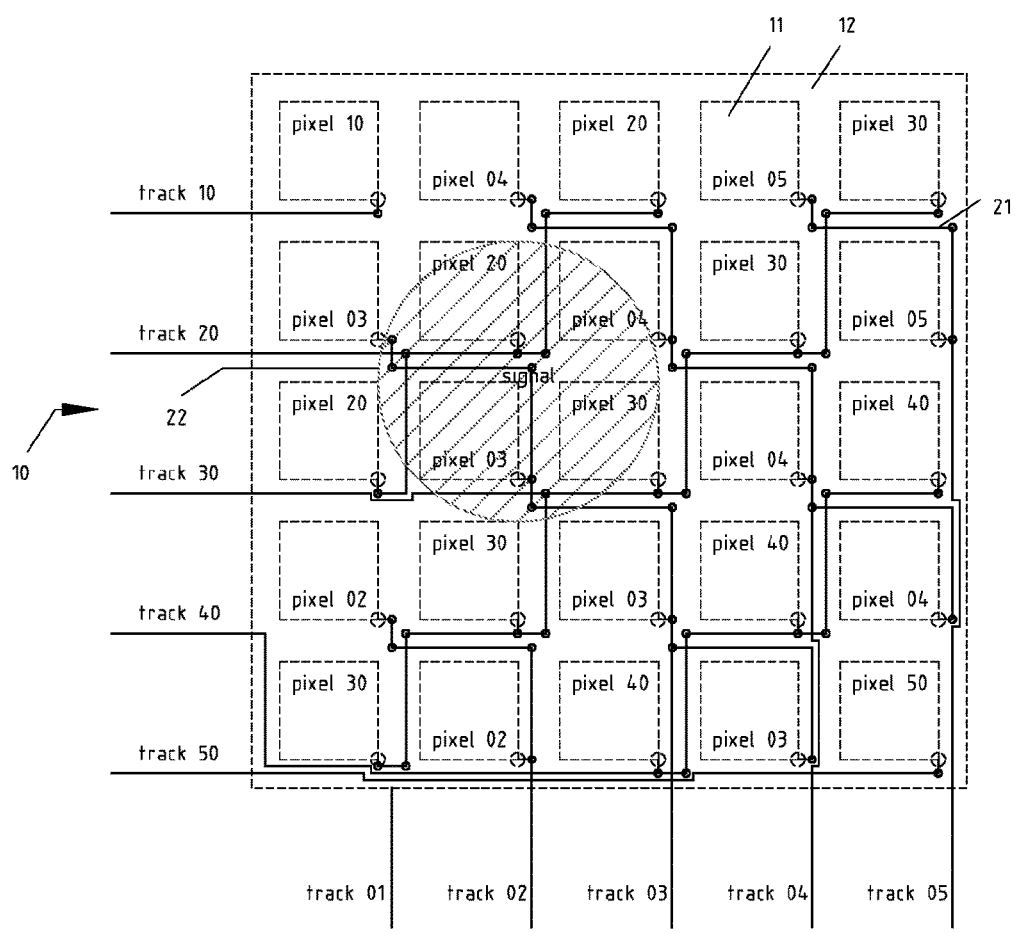
FIGS. 3 to 5 are diagrams of the active pixel detector device modified by the groups of pixels being interwoven in alternative manners.

Although FIG. 2 illustrates an example in which the lines of pixels 11 are spatially distributed in the row and column direction, the lines of pixels in each sub-array in either or both sub-arrays may be spatially distributed in other directions. By way of example, FIG. 3 illustrates the active pixel detector device 10 on which the pattern of tracks 21 is modified so that the tracks 21 are connected to lines of pixels 11 which in each sub-array are spatially distributed in a diagonal direction of the rectangular array.

Figure 4:
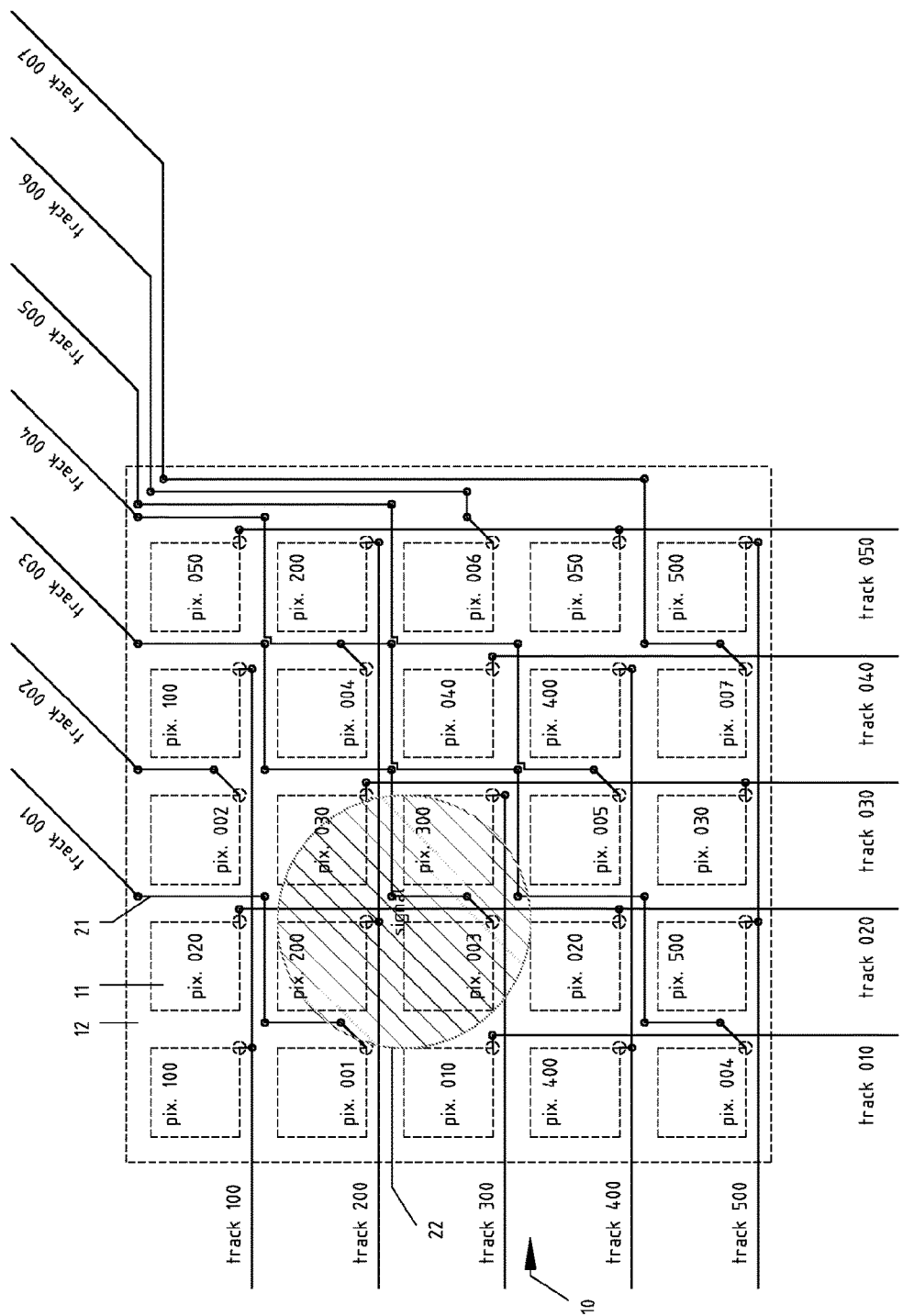

Furthermore, it is possible to provide more than two sub-arrays wherein the lines of pixels 11 in each sub-array extend in different directions. By way of example, FIG. 4 illustrates the active pixel detector device 10 in which the patterning of the tracks 21 is modified so that the pixels 11 are grouped into three sub-arrays within which the lines of pixels 11 are spatially distributed in the row direction, the column direction and a diagonal direction, the pixels 11 of the respective sub-arrays being given the labels x00, 0x0 and 00x, respectively. In this case, the pixels 11 of the three sub-arrays are again interwoven, in this case by the pixels 11 of the three sub-arrays being repeated in a sequence in the row and column directions.

Thus, it remains the case that an area 22 of charge collection of sufficient size to overlap the four pixels 11 causes output signals OUT to be supplied to a combination of four tracks 21 that is unique to the overlapped group of pixels. An example of this is illustrated in FIG. 4 where the area 22 causes output signals OUT to be supplied to two tracks 200 and 300 from the pixels of the first sub-array, to the track 030 from the pixel in the second sub-array and to the track 003 from the pixel in the third sub-array. Thus, again, the combination of tracks 21 on which the output signal OUT are temporally coincident indicates the position of the area 22 of charge collection.

The use of three or more sub-arrays also assists in resolving coincidence ambiguities that arise when plural input events occur simultaneously.

For the case of FIGS. 2 and 3, the interweaving patterns are such that the unique relationship between groups of adjacent pixels and combinations of tracks exists for groups of four adjacent pixels, and therefore is an example of the case that n is four. This arises because of the local symmetry in the inter-weaving pattern. However other interweaving patterns without such local symmetry may be used to provide a unique relationship between groups of adjacent pixels and combinations of tracks for groups of two or three pixels.

FIG. 4 illustrates such an example with three sub-arrays of pixels, where the local symmetry is prevented by means of diagonal tracks. In this example of a weaving pattern, any group of three adjacent pixels 11 capable of collecting charge from a single input event are connected to a combination of three tracks that is unique to the group of pixels 11. This means that an area 22 of charge collection of that sufficient size to overlap a group of three pixels causes signals to be supplied on a unique combination of four tracks. For example, if the area 22 of charge collection shown in FIG. 4 is reduced in size so that it only overlaps the pixels 200, 003 and 300, then signals are supplied on tracks 200, 003 and 300. Accordingly position sensitive detection may be provided on detection of coincident signals on a group of three tracks. The position is indicated by the combination of three tracks that is unique to a group of three adjacent pixels.

In the example shown in FIG. 4, position detection may be improved by shifting alternate rows (or columns) of pixels by half the pixel pitch to form a hexagonal array. In that case, the shape of the pixels may also be changed to be hexagonal.

Figure 5:
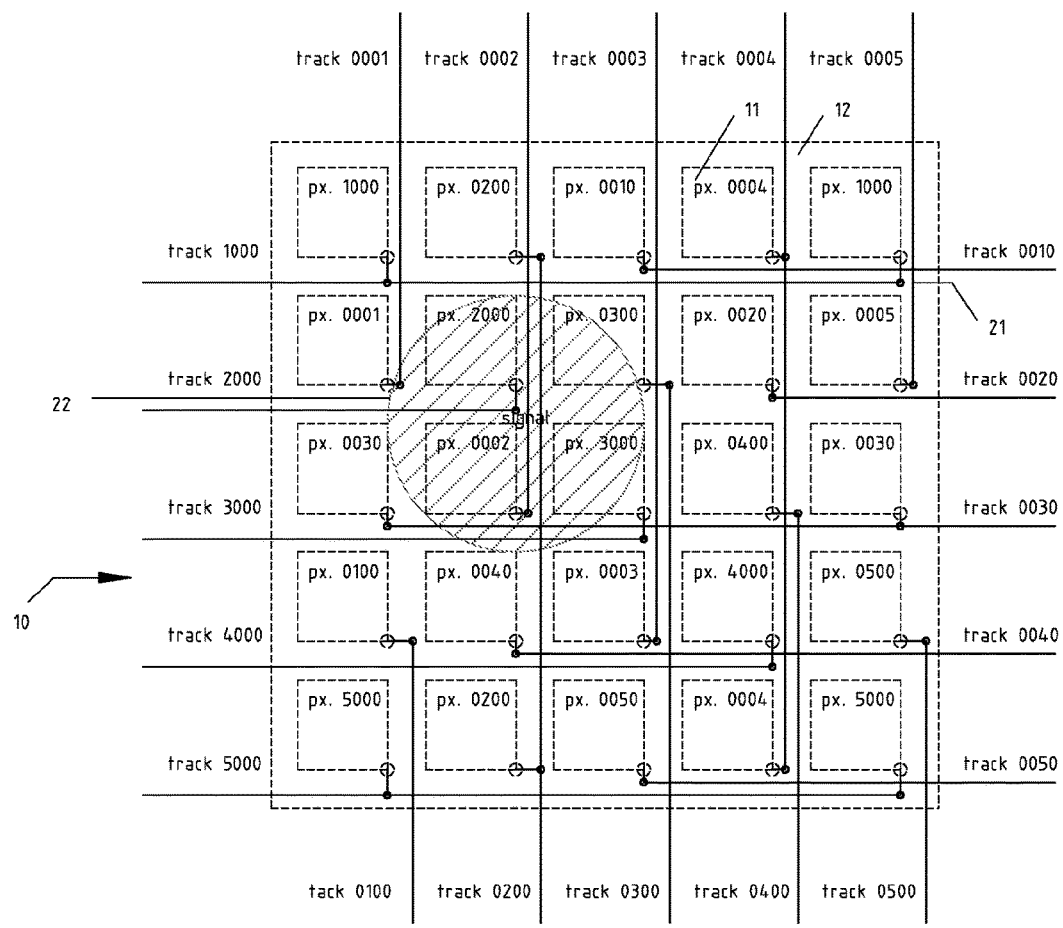

Further, FIG. 5 illustrates an example with four sub-arrays of pixels, two along row and two along column directions. In this example of a weaving pattern, any group of two adjacent pixels 11 capable of collecting charge from a single input event are connected to a combination of two tracks that is unique to the group of pixels 11. This means that an area 22 of charge collection of that sufficient size to overlap a group of two pixels causes signals to be supplied on a unique combination of two tracks. For example, if the area 22 of charge collection shown in FIG. 4 is reduced in size so that it only overlaps the pixels 200 and 003, then signals are supplied on tracks 200 and 003. Accordingly position sensitive detection may be provided on detection of coincident signals on a group of two tracks. The position is indicated by the combination of two tracks that is unique to a group of two adjacent pixels.

In the above examples, the sets of pixels 11 to which each track 21 is connected are straight lines of pixels 11. This is advantageous because it simplifies the signal analysis used to determine the position of an area 22 of charge collection, because the lines on which an output signal appears directly identifies the position in the direction in which the lines of pixels 11 are spatially distributed within a given sub-array. However, more generally it would be possible for the sets of pixels 11 to which each track 21 is connected to have shapes or distributions other than a line, provided that the sets of pixels are interwoven to meet the condition that an area 22 of charge collection sufficient to overlap a group of adjacent pixels causes signals to be supplied to a combination of tracks that is unique to that overlapped group of pixels 11.

If this condition is met, then it would still be possible to determine the position of the area of area 22 of charge collection from the specific combination of tracks on which output signals OUT are temporally coincident, but the signal analysis would be more difficult, since it would be necessary to relate each possible combination of four tracks to a given position, for example using a look-up table.

The examples described above include twenty-five pixels 11 but in general any number of pixels 11 may be provided by repeating the pattern of connecting the tracks 21.

In the examples described above, the array of pixels 11 is a regular, rectangular array, but this is not essential. The pixels 11 may be arranged in a regular array that is not rectangular. For example the pixels 11 could be arranged in a hexagonal array in which the individual pixels 11 are hexagonal. In that case, the pixels 11 might be grouped into three sub-arrays within which lines of pixels that are connected to the same track extend in the three major directions of the array. Another example is that the pixels 11 are arranged in concentric circular rings. In that case, one possibility is that each pixel 11 is a sector of a ring, the pixels 11 of one sub-array are arranged in sets that are rings of the same radius, and the pixels 11 of the other sub-array are grouped into straight radial lines, whereby the position of an area of charge collection is indicated in polar coordinates.

Furthermore, the array of pixels 11 might be irregular. An example of this is the pixels are provided with different densities in different areas of the active pixel detector device 10 as appropriate for a given application.

Irrespective of whether the array is regular or irregular, it is desirable that the pixels 11 are distributed continuously across the active area of the active pixel device 10, so as to provide position-sensitive detection of events across that entire area without occlusions.

In order to provide such position-sensitive detection with a maximum possible resolution, the area 22 of charge collection must be of sufficient size to overlap the group of n pixels 11. For instance, in the example where n is four, if the area 22 of charge collection is only of sufficient size to overlap one or two pixels in the pattern of FIG. 2 or 3, then output signals OUT are supplied to two tracks 21, but the group of pixels 11 from which the output signals might be derived is not unique. That being said, an area of charge collection of smaller size may still provide for position-sensitive detection at a lower resolution. For instance, in the example where n is four, then two groups of two adjacent pixels are each connected to a combination of the same two tracks. For example, in FIG. 2 there two groups of two pixels 02 and 20 attached to tracks 02 and 20. This means that an area of charge collection of size sufficient to overlap two adjacent pixels causes output signals OUT to be supplied to two tracks 21 for each of the two groups of two pixels. This still provides position sensitive detection, but with a reduced spatial resolution due to the ambiguity between the two groups of two pixels.

The active pixel detector device 10 is designed to maximize the spatial resolution for a given type or range of event. The active pixel device 10 is designed to provide an area 22 of charge collection of the desired size in respect of that type or range of events, depending on the physical interaction in the semiconductor layer 12. The size of the pixels 11 is then selected to allow such an area 22 to overlap a group of n pixels. The size and the pitch of the pixels 11 is optimized to maximized the spatial resolution for a given type or range of events.

Figure 6:
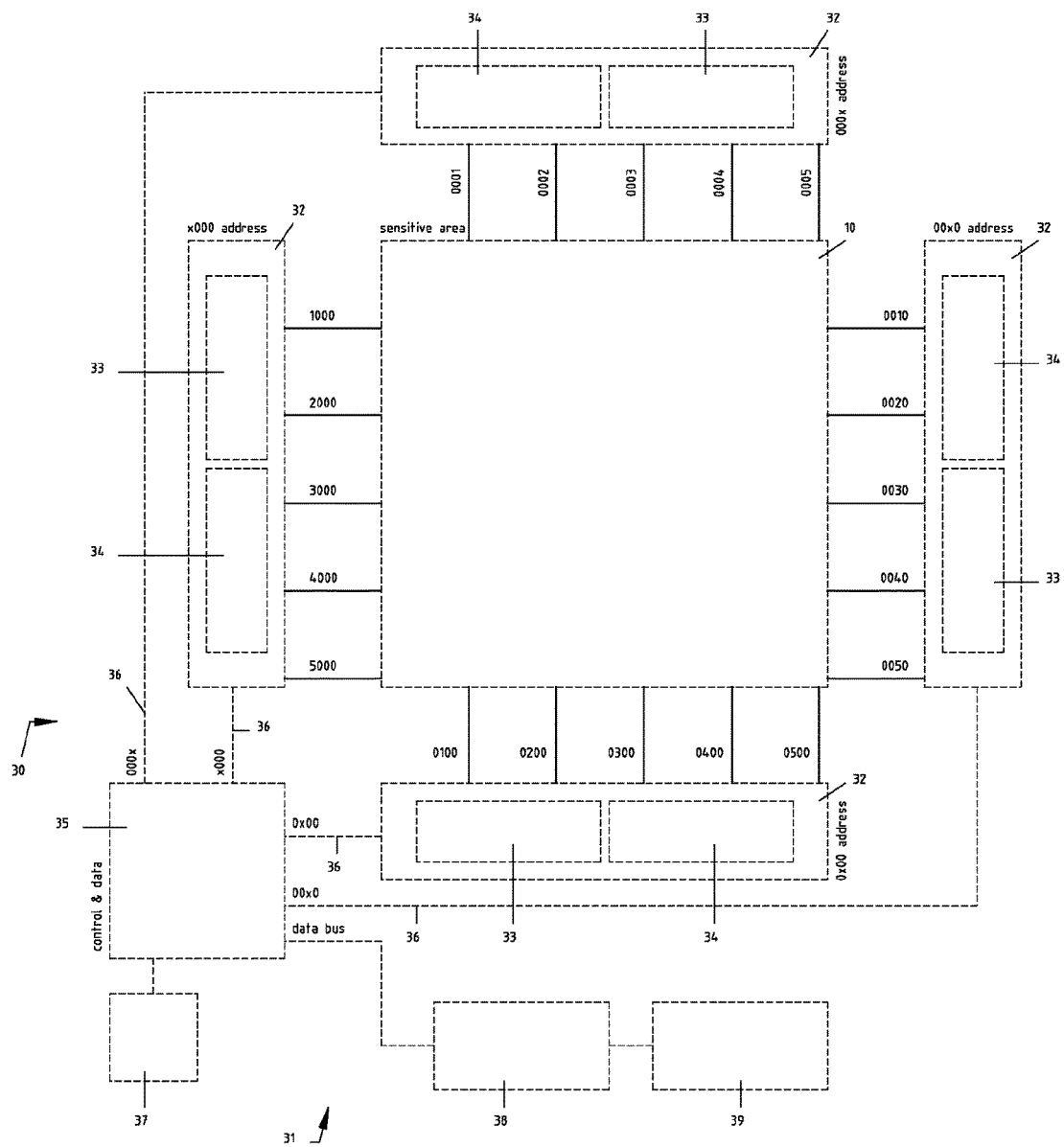
FIG. 6 is a diagram of a detector incorporating the active pixel detector devices of FIG. 2.

FIG. 6 shows a detector 30 incorporating the active pixel detector device 10 and further comprising a readout circuit 31 for processing the output signals OUT.

The readout circuit 31 includes an addressing block 32 in respect of each of the sub-arrays of pixels 11. FIG. 6 illustrates an example in which four addressing blocks 32 are provided for four sub-arrays of pixels 11, but if the number of sub-arrays of pixels 11 is less, as in FIGS. 2 and 3, then the number of addressing blocks 32 may be correspondingly reduced.

The addressing blocks 32 are connected to the reset control lines 17 of the pixels 11 in the sub-array and to the tracks 21 that are connected to the outputs 20 of the pixels 11 in the sub-array.

Each addressing block 32 contains a control block 33 containing the circuitry, such as latches, switches or buffers, necessary to control the supply of the reset control signal RST on the reset control lines 17 at appropriate timings. The control block 33 may have a similar construction to the corresponding block of a conventional active pixel detector device.

Each addressing block 32 also includes a readout block 34 comprising circuitry to readout the output signals OUT on the tracks 21 and convert them into digital data. The readout block 34 may have similar construction to the corresponding block of a conventional active pixel detector device, for example including an amplifier, an ADC (analogue-to-digital converter), and a clock with generators multipliers and memory. However, the addressing block 32 is simpler than the corresponding addressing block of a conventional active pixel detector device in that the addressing block 32 does not need to provide circuitry for controlling sampling devices in the pixels 11 for scanning of the detector and does not need to time-multiplex the readout output signals OUT to identify the position in accordance with such scanning.

The addressing blocks 32 are connected to a processing unit 35 by respective databuses 36 that contain digital circuitry to serialize, de-serialize, cash and buffer digital signals. The processing unit 35 has a similar overall function and construction of a corresponding processing unit of a conventional active pixel detector device and may be implemented by a processor running an appropriate program, or by dedicated hardware. The processing unit 35 receives a clock signal from a clock 37 for overall synchronization of the operation of the detector 30.

The processing unit 35 controls the overall operation of the detector 30 and may receive control data from a data buffer 38, for example derived from user input, and may output control data over the databuses 36 to control the operation of the addressing blocks 32.

Each addressing block 32 supplies the output signals OUT that have been converted into digital signals by the readout block 34 to the databus 36 which transfers them to the processing unit 35. The processing unit 35 then processes the output signals OUT to detect events and output signals indicating the position of events by implementing the processing shown in FIG. 7, as follows.

In step S1, the processing unit 35 continually monitors the output signals on the tracks 21 and sets a detection flag when the output signals OUT there is temporal coincidence of output signals on a combination of at least n tracks that are connected to a group of n adjacent pixels 11. For example, in the case of the tracks 21 being patterned as shown in FIG. 2, the criteria for setting the detection flag might be a temporally coincident output signal on two adjacent tracks 21 in each sub-array.

In response to being interrupted by the detection flag, the processing unit 35 in step S2 reads the addresses that identify the tracks 21 on which the temporally coincident signals have been detected. Then in step S3, the processing unit 35 determines the position of the area 22 of charge collection and hence the position of the event on the basis of the read addresses identifying the tracks. As the combination of n tracks is unique to an overlapped group of pixels 11 in the array, the combination of tracks 21 corresponds to the position of that group of pixels. Thus, the position of the corresponding group of n pixels is detected as the position of the area 22 of charge collection and hence the event.

In the case of a regular arrangement of the sub-arrays in which the lines of pixels spatially distributed in the same direction, the detection of position may be performed by a simple arithmetic operation from the positions of the lines. For example with the patterning of tracks 21 shown in FIG. 2, the position in the row and column directions is determined directly from the two adjacent tracks 21 in each sub-array on which signals are temporally coincident. More generally, in the case of more complicated patterns of interweaving, the position may still be uniquely determined, for example using a look-up table that relates all possible combinations of groups of n pixels to the positions of those groups.

In step S4, the processing unit 35 outputs a signal identifying the position of the area of charge collection and hence the event. The signal may be stored as a data element in respect of each event identifying the position and the time of the event, for example by adding a time stamp to the position information. Such data may be output from the processing unit 35 to a data buffer 39 as digital data for storage or display.

The processing implemented in the processing unit 35 may include additional steps to resolve coincidence ambiguities that arise when plural input events occur simultaneously.

Figure 7:
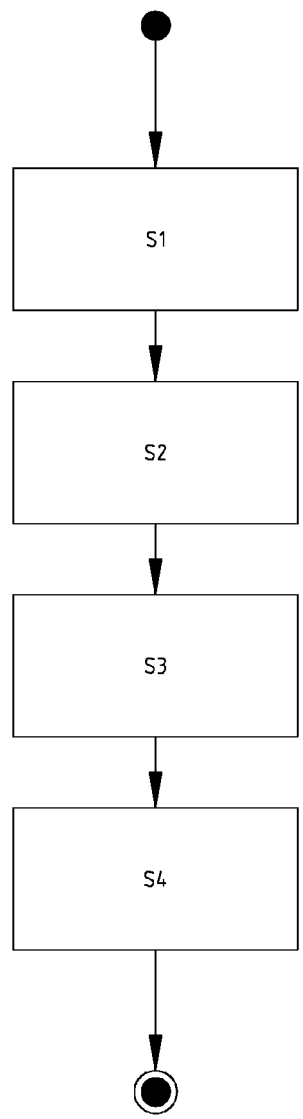
FIG. 7 is a flow chart of processing implemented in the readout circuit of the detector of FIG. 6.

The processing unit 35 has a similar overall function to a corresponding processing unit of a conventional active pixel detector device, but is modified by the implementation of the processing shown in FIG. 7 to detect the position of input events. However, this processing is a relatively simple piece of logic that may be implemented in a straightforward manner, and in particular is significantly easier to implement than the scanned addressing in a conventional active pixel detector device.

Next, there is described the weaved strip detector device 50.

The weaved strip detector device 50 has a similar overall construction to a conventional strip detector device. As shown in cross-section in FIG. 8, the weaved strip detector device 50 comprises a semiconductor layer 51 of semiconductor material, for example silicon. On one side of the semiconductor layer 51 there is formed an array of pixels 52 each comprising a contact 53, where each pixel may consist of an active area of doped semiconductor material and an Ohmic junction. On the other opposite side of the semiconductor layer 51 there is formed a contact 54 that also may consist of an active area of doped semiconductor material. The common contact 54 is connected to an electrode arrangement 65 to allow the application of a potential across the semiconductor layer 51 between the electrode arrangement 65 and the tracks 56.

The contact 53 of the pixels 52 and the common contact 54 are of opposite doping, one being n-type and the other being p-type. The remainder of the semiconductor layer 51 between the contacts 53 and the common contact 54 may be undoped, so that each pixel is formed as a PIN (p-intrinsic-n) diode. Consequently, the contacts 53 of the pixels 52 collect charge generated by an input event in the semiconductor layer 51. An event such as an interaction with a particle to be detected causes charges to be generated in an area of the semiconductor layer 51 around the event, which charge is collected by the contacts 53 of the pixels 52 overlapping that area. The pixels 52 are arranged to operate in a conductive mode in which the charge collected thereby is measured as a current.

The weaved strip detector device 50 further comprises a track structure 55 comprising tracks 56 that are conductive, for example being metal, which are separated from unwanted portions of the semiconductor layer 51 and from each other by insulating layers 58 formed of an insulating material such as silicon oxide.

The tracks 56 are connected to the contacts 53 of the pixels 52 in the same pattern as the connection of tracks 21 in the active pixel detected device 10. Accordingly, the above description of the patterning of the tracks 21 of the active pixel detected device 10 applies equally to the patterning of the tracks 56 in the weaved strip detector device 50 and for brevity will not be repeated. FIGS. 9 to 12 are plan views of an array of the weaved strip detector device 50 in which the sets of pixels 52 have similar arrangement as the pixels 11 in the active pixel detector device 10 shown in FIGS. 2 to 5.

Figure 8:
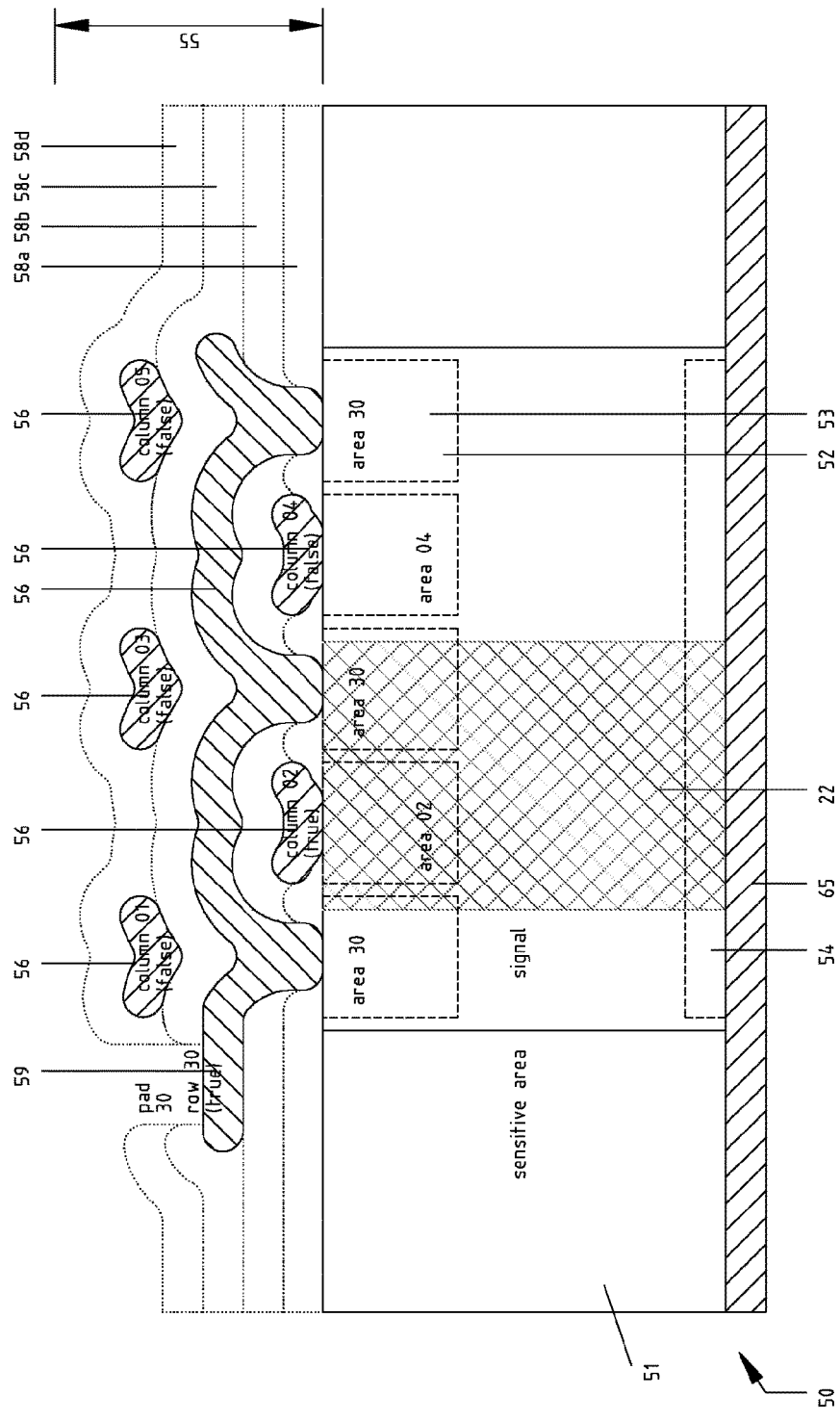
FIG. 8 is a cross-sectional view of a weaved strip detector device.
Figure 9:
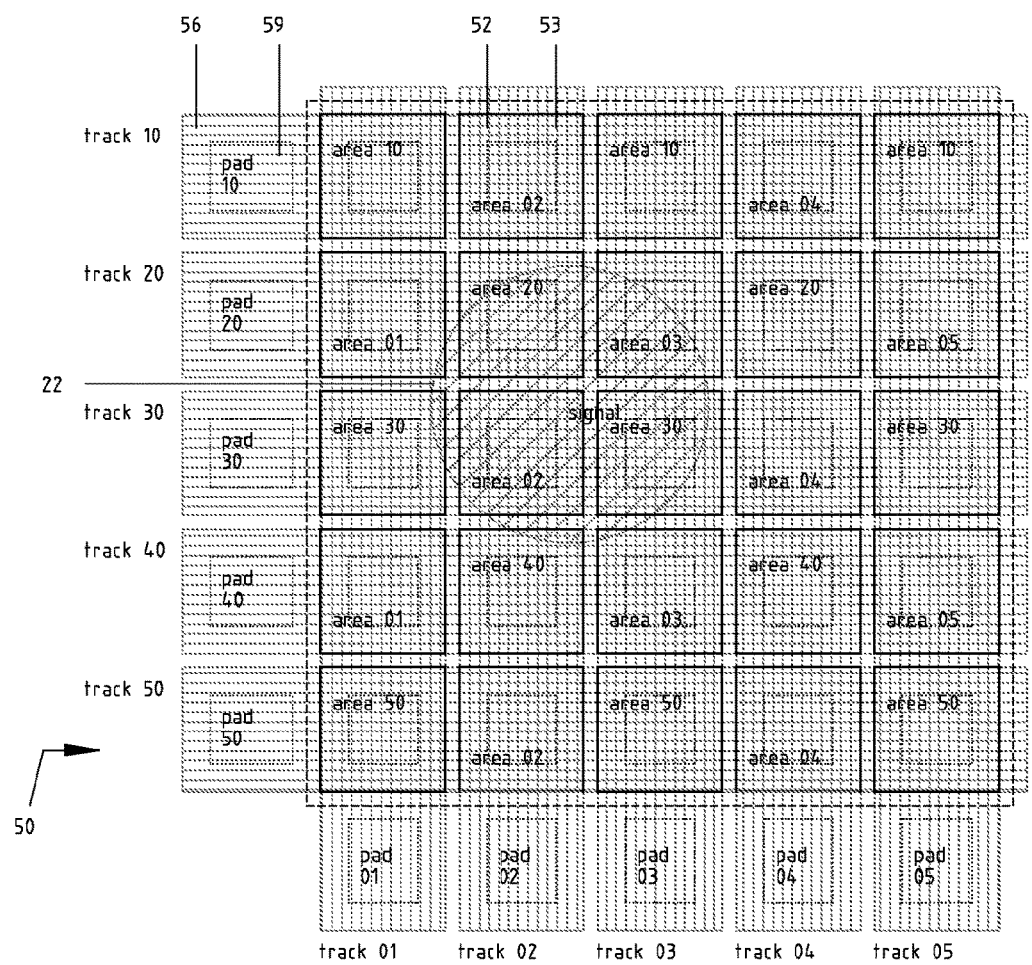
FIG. 9 is a diagram of the weaved strip detector device of FIG. 8.
Figure 10:
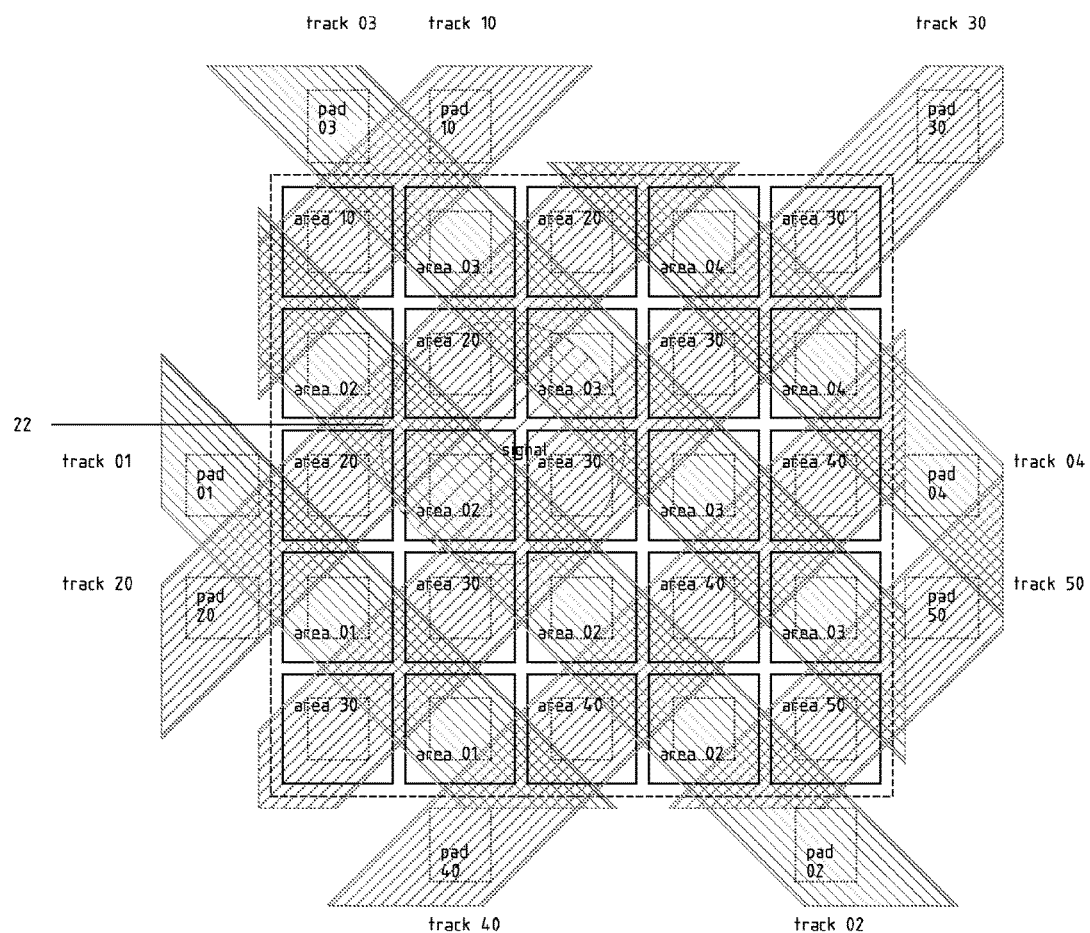
FIGS. 10 to 12 are diagrams of the weaved strip detector device modified by the groups of pixels being interwoven in alternative manners.
Figure 11:
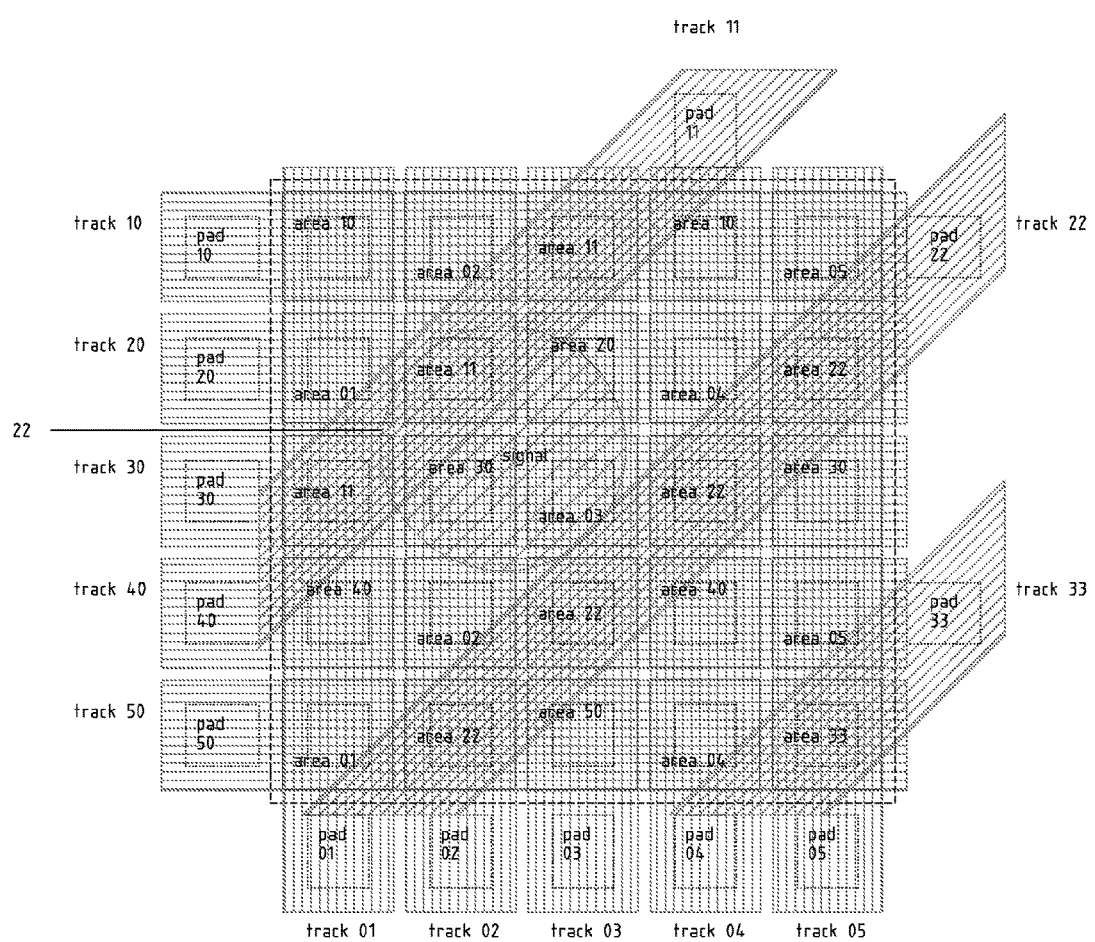
Figure 12:
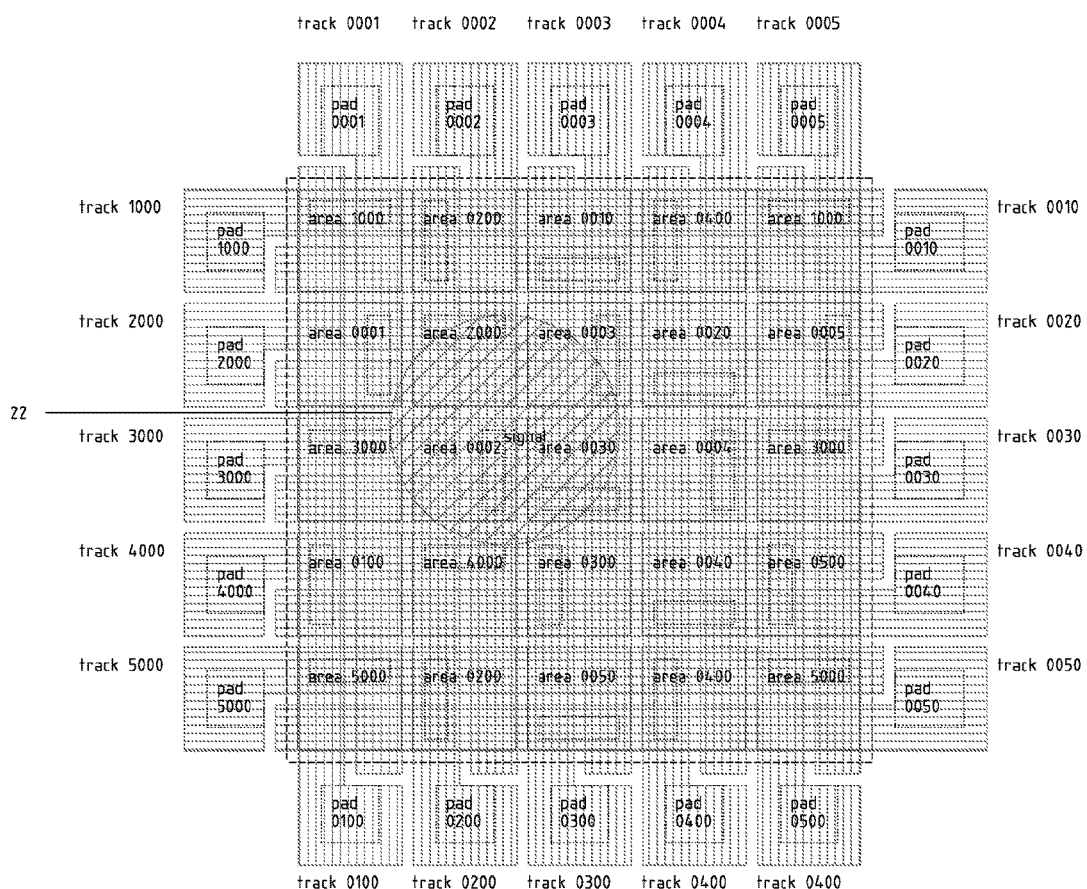

This patterning is achieved in the weaved strip detector device 50 by physically weaving the tracks 56 that are connected to one sub-array with the tracks 56 connected to the other sub-array, so that the tracks 56 touch the contacts 53 to which they are connected and arch over the contacts 53 to which they are not connected, as shown in FIG. 8.

This weaving of the tracks 56 may be achieved by successive deposition of the layers 58*a* to 58*d* of insulating material, together with successive parts of the tracks 56, to build up the track structure 55. Thus, the first insulating layer 58*a* is deposited to provide selective contact between the tracks 56 and the contacts 53 of the pixels 52. The second and third insulating layers 58*b* and 58*c* separate the tracks 56 as they arch over the parts of the tracks 56 connected to the pixels of the other sub-array, and the fourth insulating layer 58*d* covers the entire track structure 55 for protection. Each track 56 is provided with a contact pad 59 outside the area of the array of pixels 52 and left uncovered by the insulating material to allow connection to the readout circuit 61 described below.

The weaved strip detector device 50 therefore provides the advantage of allowing position-sensitive detection in a similar manner to a conventional strip detector device but without requiring the formation of strips of contacts from which a signal is read out on both sides of a semiconductor layer 51. This greatly simplifies the fabrication process and therefore reduces manufacturing costs.

However, as an alternative, the common contact 54 may be replaced by a second array of pixels 52 having the same arrangement as the first array of pixels 52 shown in FIG. 8 but on the opposite side of the semiconductor layer 51. In this case an additional track structure 55 is provided on thereto to allow connection thereto. This effectively forms a stack of two arrays of pixels combined on the same semiconductor layer 51 in the same weaved strip detector device 50, each of the arrays of pixels 52 allowing independent position-sensitive detection of the charge generated by an input event.

The provision of such a stack of two arrays of pixels 52 requires formation of an array of contacts 53 on both sides and thus has a similar manufacturing complexity to a conventional strip detector device. However, it provides advantages of a conventional strip detector device in that each array of pixels 52 can provide independent position sensitive detection. Thus it is possible, for example, to increase the resolution of the detection of position or in the case of particle detection to allow the detection of the trajectory of the particle, and therefore calculation of input angle.

Figure 13:
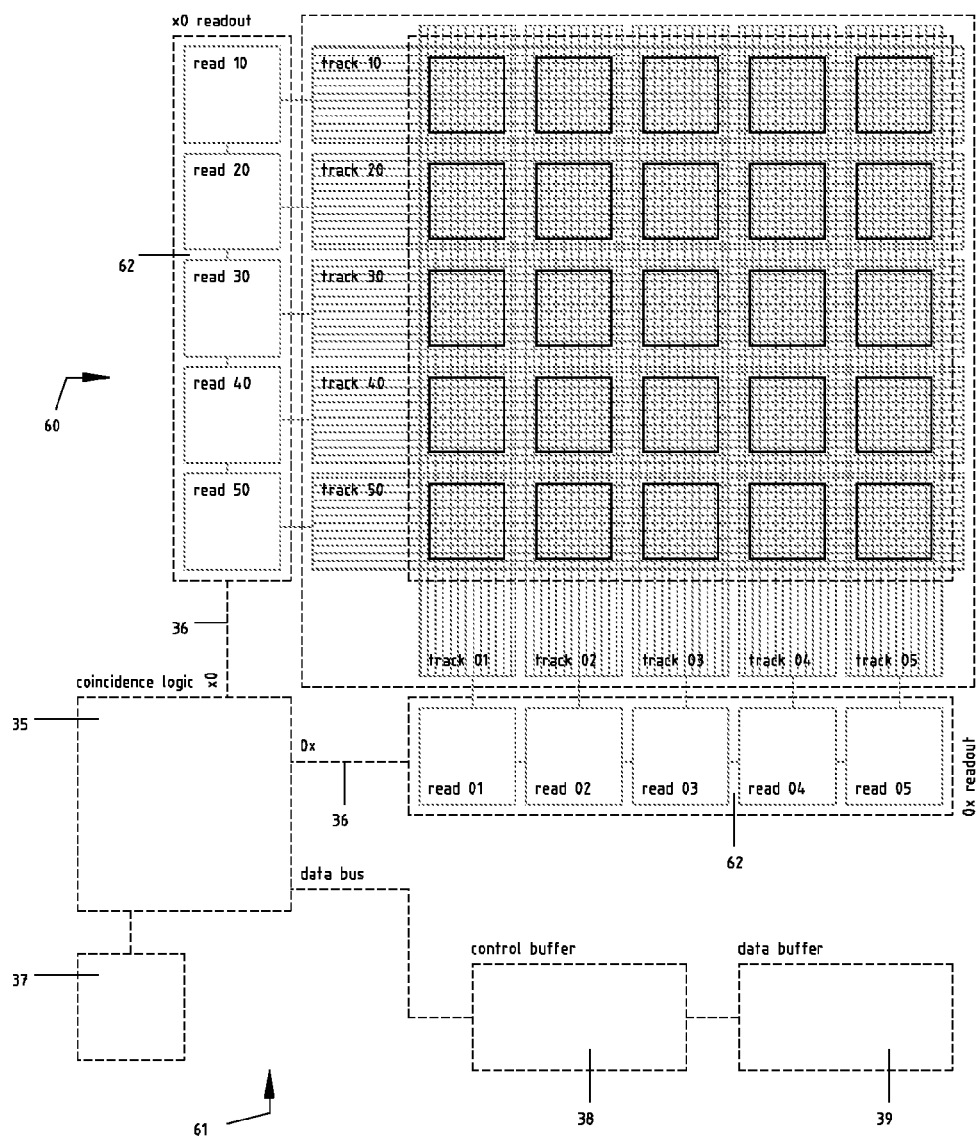
FIG. 13 is a diagram of a detector incorporating the weaved strip detector device of FIG. 9.

FIG. 13 shows a detector 60 incorporating the weaved strip detector device 50 and further comprising a readout circuit 61 for processing the output signals from each pixel 52. The readout circuit 61 has the same construction as the readout circuit 31 in the detector 30 except that the addressing blocks 32 are replaced by readout blocks 62 described below. As the weaved strip detector device 50 is operated in a conductive mode, the readout blocks 62 merely contain circuits for amplifying the signals appearing on the tracks 56 and converting them into a digital signal. The elements of the readout circuit 61 other than the readout blocks 62 are labeled by the same reference numerals as in the readout circuit 31 and for brevity a description thereof is not repeated.

The active pixel detector device 10 and the weaved strip detector device 50 may be designed to detect a variety of different events.

One possible use is as a particle detector in which case the input event is detection of a particle, which may be a charged particle such as an electron or a photon. In this context, a photon is considered to be a massless particle. The incident particle interacts with the layer of semiconductor material to generate electron-hole pairs which migrate in opposite directions across the semiconductor layer 12 or 51 under the applied electric field to be detected by the pixels 11 across a wide area 22. Such applications include scientific and medical imaging. Applications where the particle is a photon include X-ray detection, for example for electron microscopy, X-ray diffractometry, radiology or radiotherapy.

The invention claimed is:

1. A detector comprising a semiconductor detector device and a readout circuit, the semiconductor detector device comprising:

a layer of semiconductor material for generating charge in response to input events;

an array of pixels formed in the layer of semiconductor material-therein for collecting charge generated in the layer of semiconductor material, the pixels of the array being spatially distributed in two dimensions;

tracks connected to the pixels and to the readout circuit to supply signals from the pixels representing the collected charge to a readout circuit, each pixel being connected to a single one of said tracks, wherein the pixels of the array are grouped into lines of pixels spatially distributed across the array, all the pixels of the array within a line of pixels of the array being connected to the same track, the lines of pixels being interwoven so that any group of n adjacent pixels overlapped by an area of charge collection generated by a single input event, which area of charge collection is of sufficient size to overlap only the pixels of the group is connected to a combination of n tracks, which combination of n tracks is unique to the group of pixels, where n has a value of one of 2, 3 or 4, and the lines of pixels are grouped into at least three sub-arrays of pixels, the lines of pixels within each sub-array being spatially distributed across the array of pixels in directions which are different for each sub-array, and the readout circuit being arranged to detect temporally coincident signals on a combination of at least n tracks and to output a signal indicating the position of the area of charge collection corresponding to the detected combination of tracks.

2. A detector according to claim 1, wherein the array of pixels is a regular rectangular array, the lines of pixels being straight lines of pixels.

3. A detector according to claim 2, wherein the at least three sub-arrays of pixels include a sub-array in which the pixels of each line are spatially distributed in a row direction of the rectangular array, a sub-array in which the pixels of each line are distributed in a column direction of the rectangular array, and a sub-array in which the pixels of each line are spatially distributed in a diagonal direction of the rectangular array.

4. A detector according to claim 1, wherein the lines of pixels are grouped into three sub-arrays of pixels.

5. A detector according to claim 1, wherein the pixels of the array are arranged to be operated in a voltaic mode in which the charge collected by the pixels accumulates, and each pixel of the array further comprises a buffer device arrangement arranged to buffer a signal representative of the charge collected by each-pixel, the tracks being connected to the buffer device arrangement to receive the signal buffered thereby.

6. A detector according to claim 5, wherein each pixel of the array further comprises a reset device arrangement arranged to selectively apply a reset voltage to each pixel for resetting the pixel.

7. A detector according to claim 5, wherein the layer of semiconductor material has a CMOS construction.

8. A detector according to claim 1, wherein the pixels are arranged to be operated in a conductive mode in which the charge collected by the pixels is measured as a current.

9. A detector according to claim 8, wherein the layer of semiconductor material is for generating charge from an incident particle and the pixels each comprise a contact comprising an active area of doped semiconductor material on one side of the layer of semiconductor material for collecting charge generated in the layer of semiconductor material.

* * * * *